US010998040B2

(12) United States Patent
Shu et al.

(10) Patent No.: US 10,998,040 B2
(45) Date of Patent: May 4, 2021

(54) COMPUTATIONAL MEMORY CELL AND PROCESSING ARRAY DEVICE USING THE MEMORY CELLS FOR XOR AND XNOR COMPUTATIONS

(71) Applicant: GSI Technology, Inc., Sunnyvale, CA (US)

(72) Inventors: Lee-Lean Shu, Sunnyvale, CA (US); Eli Ehrman, Sunnyvale, CA (US)

(73) Assignee: GSI TECHNOLOGY, INC., Sunnyvale, CA (US)

( * ) Notice: Subject to any disclaimer, the term of this patent is extended or adjusted under 35 U.S.C. 154(b) by 0 days.

(21) Appl. No.: 15/709,399

(22) Filed: Sep. 19, 2017

(65) Prior Publication Data

US 2018/0158519 A1 Jun. 7, 2018

Related U.S. Application Data

(60) Provisional application No. 62/430,767, filed on Dec. 6, 2016.

(51) Int. Cl.
| | | |
|---|---|---|
| *G11C 11/419* | (2006.01) | |
| *G11C 11/418* | (2006.01) | |
| *G11C 7/10* | (2006.01) | |
| *G11C 7/18* | (2006.01) | |
| *G11C 15/04* | (2006.01) | |

(52) U.S. Cl.
CPC .......... *G11C 11/419* (2013.01); *G11C 7/1006* (2013.01); *G11C 7/18* (2013.01); *G11C 11/418* (2013.01); *G11C 15/04* (2013.01)

(58) Field of Classification Search
CPC ..... G11C 11/41; G11C 11/416; G11C 11/418; G11C 11/419

USPC ........ 365/154, 156, 189.011, 189.04, 230.05
See application file for complete search history.

(56) References Cited

U.S. PATENT DOCUMENTS

| | | |
|---|---|---|
| 3,451,694 A | 6/1969 | Hass |
| 3,747,952 A | 7/1973 | Graebe |
| 3,795,412 A | 3/1974 | John |
| 4,227,717 A | 10/1980 | Bouvier |
| 4,308,505 A | 12/1981 | Messerschmitt |
| 4,587,496 A | 5/1986 | Wolaver |
| 4,594,564 A | 6/1986 | Yarborough, Jr. |
| 4,677,394 A | 6/1987 | Vollmer |
| 4,716,322 A | 12/1987 | D'Arrigo et al. |
| 4,741,006 A | 4/1988 | Yamaguchi et al. |
| 4,856,035 A | 8/1989 | Lewis |

(Continued)

FOREIGN PATENT DOCUMENTS

| | | |
|---|---|---|
| CN | 104752431 | 7/2015 |
| DE | 10133281 A1 | 1/2002 |
| JP | 2005-346922 | 12/2005 |

OTHER PUBLICATIONS

US 10,564,982 B1, 02/2020, Oh et al. (withdrawn)

(Continued)

*Primary Examiner* — Alfredo Bermudez Lozada
(74) *Attorney, Agent, or Firm* — DLA Piper LLP (US)

(57) ABSTRACT

A memory cell and processing array that has a plurality of memory are capable of performing logic functions, including an exclusive OR (XOR) or an exclusive NOR (XNOR) logic function. The memory cell may have a read port in which the digital data stored in the storage cell of the memory cell is isolated from the read bit line.

18 Claims, 10 Drawing Sheets

(56) References Cited

U.S. PATENT DOCUMENTS

| | | |
|---|---|---|
| 5,008,636 A | 4/1991 | Markinson |
| 5,302,916 A | 4/1994 | Pritchett |
| 5,375,089 A | 12/1994 | Lo |
| 5,382,922 A | 1/1995 | Gersbach |
| 5,400,274 A | 3/1995 | Jones |
| 5,473,574 A | 12/1995 | Clemen et al. |
| 5,530,383 A | 6/1996 | May |
| 5,535,159 A | 7/1996 | Nii |
| 5,563,834 A | 10/1996 | Longway et al. |
| 5,587,672 A | 12/1996 | Ranganathan et al. |
| 5,608,354 A | 3/1997 | Hori |
| 5,661,419 A | 8/1997 | Bhagwan |
| 5,696,468 A | 12/1997 | Nise |
| 5,736,872 A | 4/1998 | Sharma et al. |
| 5,744,979 A | 4/1998 | Goetting |
| 5,744,991 A | 4/1998 | Jefferson et al. |
| 5,748,044 A | 5/1998 | Xue |
| 5,768,559 A | 6/1998 | Iino et al. |
| 5,805,912 A | 9/1998 | Johnson et al. |
| 5,883,853 A | 3/1999 | Zheng et al. |
| 5,937,204 A | 8/1999 | Schinnerer |
| 5,942,949 A | 8/1999 | Wilson et al. |
| 5,963,059 A | 10/1999 | Partovi et al. |
| 5,969,576 A | 10/1999 | Trodden |
| 5,969,986 A | 10/1999 | Wong |
| 5,977,801 A | 11/1999 | Boerstler |
| 5,999,458 A | 12/1999 | Nishimura et al. |
| 6,005,794 A | 12/1999 | Sheffield et al. |
| 6,044,034 A | 3/2000 | Katakura |
| 6,058,063 A | 5/2000 | Jang |
| 6,072,741 A | 6/2000 | Taylor |
| 6,100,721 A | 8/2000 | Durec et al. |
| 6,100,736 A | 8/2000 | Wu et al. |
| 6,114,920 A | 9/2000 | Moon et al. |
| 6,115,320 A | 9/2000 | Mick et al. |
| 6,133,770 A | 10/2000 | Hasegawa |
| 6,167,487 A | 12/2000 | Camacho |
| 6,175,282 B1 | 1/2001 | Yasuda |
| 6,226,217 B1 | 5/2001 | Riedlinger et al. |
| 6,262,937 B1 | 7/2001 | Arcoleo et al. |
| 6,263,452 B1 | 7/2001 | Jewett et al. |
| 6,265,902 B1 | 7/2001 | Klemmer et al. |
| 6,286,077 B1 | 9/2001 | Choi et al. |
| 6,310,880 B1 | 10/2001 | Waller |
| 6,366,524 B1 | 4/2002 | Abedifard |
| 6,377,127 B1 | 4/2002 | Fukaishi et al. |
| 6,381,684 B1 | 4/2002 | Hronik et al. |
| 6,385,122 B1 | 5/2002 | Chang |
| 6,407,642 B2 | 6/2002 | Dosho et al. |
| 6,418,077 B1 | 7/2002 | Naven |
| 6,441,691 B1 | 8/2002 | Jones et al. |
| 6,448,757 B2 | 9/2002 | Hill |
| 6,473,334 B1 | 10/2002 | Bailey et al. |
| 6,483,361 B1 | 11/2002 | Chiu |
| 6,504,417 B1 | 1/2003 | Cecchi et al. |
| 6,538,475 B1 | 3/2003 | Johansen et al. |
| 6,567,338 B1 | 5/2003 | Mick |
| 6,594,194 B2 | 7/2003 | Gold |
| 6,642,747 B1 | 11/2003 | Chiu |
| 6,661,267 B2 | 12/2003 | Walker et al. |
| 6,665,222 B2 | 12/2003 | Wright et al. |
| 6,683,502 B1 | 1/2004 | Groen et al. |
| 6,683,930 B1 | 1/2004 | Dalmia |
| 6,732,247 B2 | 5/2004 | Berg et al. |
| 6,744,277 B1 | 6/2004 | Chang et al. |
| 6,757,854 B1 | 6/2004 | Zhao |
| 6,789,209 B1 | 9/2004 | Suzuki et al. |
| 6,816,019 B2 | 11/2004 | Delbo' et al. |
| 6,836,419 B2 | 12/2004 | Loughmiller |
| 6,838,951 B1 | 1/2005 | Nieri et al. |
| 6,842,396 B2 | 1/2005 | Kono |
| 6,853,696 B1 | 2/2005 | Moser et al. |
| 6,854,059 B2 | 2/2005 | Gardner |
| 6,856,202 B2 | 2/2005 | Lesso |
| 6,859,107 B1 | 2/2005 | Moon et al. |
| 6,882,237 B2 | 4/2005 | Singh et al. |
| 6,897,696 B2 | 5/2005 | Chang et al. |
| 6,933,789 B2 | 8/2005 | Molnar et al. |
| 6,938,142 B2 | 8/2005 | Pawlowski |
| 6,940,328 B2 | 9/2005 | Lin |
| 6,954,091 B2 | 10/2005 | Wurzer |
| 6,975,554 B1 | 12/2005 | Lapidus et al. |
| 6,998,922 B2 | 2/2006 | Jensen et al. |
| 7,002,404 B2 | 2/2006 | Gaggl et al. |
| 7,002,416 B2 | 2/2006 | Pettersen et al. |
| 7,003,065 B2 | 2/2006 | Homol et al. |
| 7,017,090 B2 | 3/2006 | Endou et al. |
| 7,019,569 B2 | 3/2006 | Fan-Jiang |
| 7,042,271 B2 | 5/2006 | Chung et al. |
| 7,042,792 B2 | 5/2006 | Lee et al. |
| 7,042,793 B2 | 5/2006 | Masuo |
| 7,046,093 B1 | 5/2006 | McDonagh et al. |
| 7,047,146 B2 | 5/2006 | Chuang et al. |
| 7,053,666 B2 | 5/2006 | Tak et al. |
| 7,095,287 B2 | 8/2006 | Maxim et al. |
| 7,099,643 B2 | 8/2006 | Lin |
| 7,141,961 B2 | 11/2006 | Hirayama et al. |
| 7,142,477 B1 | 11/2006 | Tran et al. |
| 7,152,009 B2 | 12/2006 | Bokui et al. |
| 7,180,816 B2 | 2/2007 | Park |
| 7,200,713 B2 | 4/2007 | Cabot et al. |
| 7,218,157 B2 | 5/2007 | Van De Beek et al. |
| 7,233,214 B2 | 6/2007 | Kim et al. |
| 7,246,215 B2 | 7/2007 | Lu et al. |
| 7,263,152 B2 | 8/2007 | Miller et al. |
| 7,269,402 B2 | 9/2007 | Uozumi et al. |
| 7,282,999 B2 | 10/2007 | Da Dalt et al. |
| 7,312,629 B2 | 12/2007 | Chuang et al. |
| 7,313,040 B2 | 12/2007 | Chuang et al. |
| 7,330,080 B1 | 2/2008 | Stoiber et al. |
| 7,340,577 B1 | 3/2008 | Van Dyke et al. |
| 7,349,515 B1 | 3/2008 | Chew et al. |
| 7,352,249 B2 | 4/2008 | Balboni et al. |
| 7,355,482 B2 | 4/2008 | Meltzer |
| 7,355,907 B2 | 4/2008 | Chen et al. |
| 7,369,000 B2 | 5/2008 | Wu et al. |
| 7,375,593 B2 | 5/2008 | Self |
| 7,389,457 B2 | 6/2008 | Chen et al. |
| 7,439,816 B1 | 10/2008 | Lombaard |
| 7,463,101 B2 | 12/2008 | Tung |
| 7,464,282 B1 | 12/2008 | Abdollahi-Alibeik et al. |
| 7,487,315 B2 | 2/2009 | Hur et al. |
| 7,489,164 B2 | 2/2009 | Madurawe |
| 7,512,033 B2 | 3/2009 | Hur et al. |
| 7,516,385 B2 | 4/2009 | Chen et al. |
| 7,538,623 B2 | 5/2009 | Jensen et al. |
| 7,545,223 B2 | 6/2009 | Watanabe |
| 7,565,480 B2 | 7/2009 | Ware et al. |
| 7,577,225 B2 | 8/2009 | Azadet et al. |
| 7,592,847 B2 | 9/2009 | Liu et al. |
| 7,595,657 B2 | 9/2009 | Chuang et al. |
| 7,622,996 B2 | 11/2009 | Liu |
| 7,630,230 B2 | 12/2009 | Wong |
| 7,633,322 B1 | 12/2009 | Zhuang et al. |
| 7,635,988 B2 | 12/2009 | Madurawe |
| 7,646,215 B2 | 1/2010 | Chuang et al. |
| 7,646,648 B2 | 1/2010 | Arsovski |
| 7,659,783 B2 | 2/2010 | Tai |
| 7,660,149 B2 | 2/2010 | Liaw |
| 7,663,415 B2 | 2/2010 | Chatterjee et al. |
| 7,667,678 B2 | 2/2010 | Guttag |
| 7,675,331 B2 | 3/2010 | Jung et al. |
| 7,719,329 B1 | 5/2010 | Smith |
| 7,719,330 B2 | 5/2010 | Lin et al. |
| 7,728,675 B1 | 6/2010 | Kennedy et al. |
| 7,737,743 B1 | 6/2010 | Gao et al. |
| 7,746,181 B1 | 6/2010 | Moyal |
| 7,746,182 B2 | 6/2010 | Ramaswamy et al. |
| 7,750,683 B2 | 7/2010 | Huang et al. |
| 7,760,032 B2 | 7/2010 | Ardehali |
| 7,760,040 B2 | 7/2010 | Zhang et al. |
| 7,760,532 B2 | 7/2010 | Shirley et al. |
| 7,782,655 B2 | 8/2010 | Shau |
| 7,812,644 B2 | 10/2010 | Cha et al. |

(56) References Cited

U.S. PATENT DOCUMENTS

| | | |
|---|---|---|
| 7,813,161 B2 | 10/2010 | Luthra |
| 7,830,212 B2 | 11/2010 | Lee et al. |
| 7,839,177 B1 | 11/2010 | Soh |
| 7,843,239 B2 | 11/2010 | Sohn et al. |
| 7,843,721 B1 | 11/2010 | Chou |
| 7,848,725 B2 | 12/2010 | Zolfaghari et al. |
| 7,859,919 B2 | 12/2010 | De La Cruz, II et al. |
| 7,876,163 B2 | 1/2011 | Hachigo |
| 7,916,554 B2 | 3/2011 | Pawlowski |
| 7,920,409 B1 | 4/2011 | Clark |
| 7,920,665 B1 | 4/2011 | Lombaard |
| 7,924,599 B1 | 4/2011 | Evans, Jr. et al. |
| 7,940,088 B1 | 5/2011 | Sampath et al. |
| 7,944,256 B2 | 5/2011 | Masuda |
| 7,956,695 B1 | 6/2011 | Ding et al. |
| 7,965,108 B2 | 6/2011 | Liu et al. |
| 8,004,920 B1 | 8/2011 | Ito et al. |
| 8,008,956 B1 | 8/2011 | Shin et al. |
| 8,044,724 B2 | 10/2011 | Rao et al. |
| 8,063,707 B2 | 11/2011 | Wang |
| 8,087,690 B2 | 1/2012 | Kim |
| 8,089,819 B2 | 1/2012 | Noda |
| 8,117,567 B2 | 2/2012 | Arsovski |
| 8,174,332 B1 | 5/2012 | Lombaard et al. |
| 8,218,707 B2 | 7/2012 | Mai |
| 8,242,820 B2 | 8/2012 | Kim |
| 8,258,831 B1 | 9/2012 | Banai |
| 8,284,593 B2 | 10/2012 | Russell |
| 8,294,502 B2 | 10/2012 | Lewis et al. |
| 8,400,200 B1 | 3/2013 | Shu et al. |
| 8,488,408 B1 | 7/2013 | Shu et al. |
| 8,493,774 B2 | 7/2013 | Kung |
| 8,526,256 B2 | 9/2013 | Gosh |
| 8,542,050 B2 | 9/2013 | Chuang et al. |
| 8,575,982 B1 | 11/2013 | Shu et al. |
| 8,593,860 B2 | 11/2013 | Shu et al. |
| 8,625,334 B2 | 1/2014 | Liaw |
| 8,643,418 B2 | 2/2014 | Ma et al. |
| 8,692,621 B2 | 4/2014 | Snowden et al. |
| 8,693,236 B2 | 4/2014 | Shu |
| 8,817,550 B1 | 8/2014 | Oh |
| 8,837,207 B1 | 9/2014 | Jou |
| 8,885,439 B1 | 11/2014 | Shu et al. |
| 8,971,096 B2 | 3/2015 | Jung et al. |
| 8,995,162 B2 | 3/2015 | Sang |
| 9,018,992 B1 | 4/2015 | Shu et al. |
| 9,030,893 B2 | 5/2015 | Jung |
| 9,053,768 B2 | 6/2015 | Shu et al. |
| 9,059,691 B2 | 6/2015 | Lin |
| 9,070,477 B1 | 6/2015 | Clark |
| 9,083,356 B1 | 7/2015 | Cheng |
| 9,093,135 B2 | 7/2015 | Khailany |
| 9,094,025 B1 | 7/2015 | Cheng |
| 9,135,986 B2 | 9/2015 | Shu |
| 9,142,285 B2 | 9/2015 | Hwang et al. |
| 9,159,391 B1 | 10/2015 | Shu et al. |
| 9,171,634 B2 | 10/2015 | Zheng |
| 9,177,646 B2 | 11/2015 | Arsovski |
| 9,196,324 B2 | 11/2015 | Haig et al. |
| 9,240,229 B1 | 1/2016 | Oh et al. |
| 9,311,971 B1 | 4/2016 | Oh |
| 9,318,174 B1 | 4/2016 | Chuang et al. |
| 9,356,611 B1 | 5/2016 | Shu et al. |
| 9,384,822 B2 | 7/2016 | Shu et al. |
| 9,385,032 B2 | 7/2016 | Shu |
| 9,396,790 B1 | 7/2016 | Chhabra |
| 9,396,795 B1 | 7/2016 | Jeloka et al. |
| 9,401,200 B1 | 7/2016 | Chan |
| 9,412,440 B1 | 8/2016 | Shu et al. |
| 9,413,295 B1 | 8/2016 | Chang |
| 9,431,079 B1 | 8/2016 | Shu et al. |
| 9,443,575 B2 | 9/2016 | Yabuuchi |
| 9,484,076 B1 | 11/2016 | Shu et al. |
| 9,494,647 B1 | 11/2016 | Chuang et al. |
| 9,552,872 B2 | 1/2017 | Jung |
| 9,608,651 B1 | 3/2017 | Cheng |
| 9,613,670 B2 | 4/2017 | Chuang et al. |
| 9,613,684 B2 | 4/2017 | Shu et al. |
| 9,640,540 B1 | 5/2017 | Liaw |
| 9,679,631 B2 | 6/2017 | Haig et al. |
| 9,685,210 B1 | 6/2017 | Ghosh et al. |
| 9,692,429 B1 | 6/2017 | Chang et al. |
| 9,697,890 B1 | 7/2017 | Wang |
| 9,722,618 B1 | 8/2017 | Cheng |
| 9,729,159 B1 | 8/2017 | Cheng |
| 9,789,840 B2 | 10/2017 | Farooq |
| 9,804,856 B2 | 10/2017 | Oh et al. |
| 9,847,111 B2 | 12/2017 | Shu et al. |
| 9,853,633 B1 | 12/2017 | Cheng et al. |
| 9,853,634 B2 | 12/2017 | Chang |
| 9,859,902 B2 | 1/2018 | Chang |
| 9,916,889 B1 | 3/2018 | Duong |
| 9,935,635 B2 | 4/2018 | Chuang et al. |
| 9,966,118 B2 | 5/2018 | Shu et al. |
| 10,065,594 B2 | 9/2018 | Fukawatase |
| 10,153,042 B2 | 12/2018 | Ehrman |
| 10,192,592 B2 | 1/2019 | Shu et al. |
| 10,249,312 B2 | 4/2019 | Kim et al. |
| 10,249,362 B2 | 4/2019 | Shu |
| 10,388,364 B2 | 8/2019 | Ishizu et al. |
| 10,425,070 B2 | 9/2019 | Cheng et al. |
| 10,521,229 B2 | 12/2019 | Shu et al. |
| 10,535,381 B2 | 1/2020 | Shu et al. |
| 10,659,058 B1 | 5/2020 | Cheng et al. |
| 10,673,440 B1 | 6/2020 | Camarota |
| 10,770,133 B1 | 9/2020 | Haig et al. |
| 10,777,262 B1 | 9/2020 | Haig et al. |
| 10,847,212 B1 | 11/2020 | Haig et al. |
| 10,847,213 B1 | 11/2020 | Haig et al. |
| 10,854,284 B1 | 12/2020 | Chuang et al. |
| 10,860,320 B1 | 12/2020 | Haig et al. |
| 10,877,731 B1 | 12/2020 | Shu et al. |
| 10,891,076 B1 | 1/2021 | Haig et al. |
| 2001/0052822 A1 | 12/2001 | Kim et al. |
| 2002/0006072 A1* | 1/2002 | Kunikiyo ............... G11C 8/16 365/230.05 |
| 2002/0060938 A1 | 5/2002 | Song |
| 2002/0136074 A1 | 9/2002 | Hanzawa et al. |
| 2002/0154565 A1 | 10/2002 | Noh et al. |
| 2002/0168935 A1 | 11/2002 | Han |
| 2003/0016689 A1 | 1/2003 | Hoof |
| 2003/0107913 A1 | 6/2003 | Nii |
| 2003/0185329 A1 | 10/2003 | Dickmann |
| 2004/0053510 A1 | 3/2004 | Little |
| 2004/0062138 A1 | 4/2004 | Partsch et al. |
| 2004/0090413 A1 | 5/2004 | Yoo |
| 2004/0160250 A1 | 8/2004 | Kim et al. |
| 2004/0169565 A1 | 9/2004 | Gaggl et al. |
| 2004/0199803 A1 | 10/2004 | Suzuki et al. |
| 2004/0240301 A1 | 12/2004 | Rao |
| 2004/0264279 A1 | 12/2004 | Wordeman |
| 2004/0264286 A1 | 12/2004 | Ware et al. |
| 2005/0024912 A1 | 2/2005 | Chen et al. |
| 2005/0026329 A1 | 2/2005 | Kim et al. |
| 2005/0036394 A1 | 2/2005 | Shiraishi |
| 2005/0186930 A1 | 8/2005 | Rofougaran et al. |
| 2005/0226079 A1 | 10/2005 | Zhu et al. |
| 2005/0226357 A1 | 10/2005 | Yoshimura |
| 2005/0253658 A1 | 11/2005 | Maeda et al. |
| 2005/0285862 A1 | 12/2005 | Noda |
| 2006/0039227 A1 | 2/2006 | Lai et al. |
| 2006/0055434 A1 | 3/2006 | Tak et al. |
| 2006/0119443 A1 | 6/2006 | Azam et al. |
| 2006/0139105 A1 | 6/2006 | Maxim et al. |
| 2006/0143428 A1 | 6/2006 | Noda |
| 2006/0248305 A1 | 11/2006 | Fang |
| 2007/0001721 A1 | 1/2007 | Chen et al. |
| 2007/0047283 A1 | 3/2007 | Miyanishi |
| 2007/0058407 A1 | 3/2007 | Dosaka et al. |
| 2007/0109030 A1 | 5/2007 | Park |
| 2007/0115739 A1 | 5/2007 | Huang |
| 2007/0139997 A1 | 6/2007 | Suzuki |
| 2007/0171713 A1 | 7/2007 | Hunter |
| 2007/0189101 A1 | 8/2007 | Lambrache et al. |

(56) References Cited

U.S. PATENT DOCUMENTS

| | | |
|---|---|---|
| 2007/0229129 A1 | 10/2007 | Nakagawa |
| 2008/0010429 A1 | 1/2008 | Rao |
| 2008/0049484 A1 | 2/2008 | Sasaki |
| 2008/0068096 A1 | 3/2008 | Feng et al. |
| 2008/0079467 A1 | 4/2008 | Hou et al. |
| 2008/0080230 A1 | 4/2008 | Liaw |
| 2008/0117707 A1 | 5/2008 | Manickavasakam |
| 2008/0129402 A1 | 6/2008 | Han et al. |
| 2008/0155362 A1 | 6/2008 | Chang et al. |
| 2008/0175039 A1 | 7/2008 | Thomas |
| 2008/0181029 A1 | 7/2008 | Joshi et al. |
| 2008/0265957 A1 | 10/2008 | Luong et al. |
| 2008/0273361 A1 | 11/2008 | Dudeck et al. |
| 2009/0027947 A1 | 1/2009 | Takeda |
| 2009/0089646 A1 | 4/2009 | Hirose |
| 2009/0141566 A1 | 6/2009 | Arsovski |
| 2009/0154257 A1 | 6/2009 | Fujioka et al. |
| 2009/0161468 A1 | 6/2009 | Fujioka |
| 2009/0231943 A1 | 9/2009 | Kunce et al. |
| 2009/0256642 A1 | 10/2009 | Lesso |
| 2009/0296869 A1 | 12/2009 | Chao et al. |
| 2009/0319871 A1 | 12/2009 | Shirai et al. |
| 2010/0020590 A1 | 1/2010 | Hsueh et al. |
| 2010/0085086 A1 | 4/2010 | Nedovic et al. |
| 2010/0157715 A1* | 6/2010 | Pyeon ............... G11C 7/20 365/230.05 |
| 2010/0169675 A1 | 7/2010 | Kajihara |
| 2010/0172190 A1 | 7/2010 | Lavi |
| 2010/0177571 A1 | 7/2010 | Shori et al. |
| 2010/0214815 A1 | 8/2010 | Tam |
| 2010/0232202 A1 | 9/2010 | Lu |
| 2010/0260001 A1 | 10/2010 | Kasprak et al. |
| 2010/0271138 A1 | 10/2010 | Thakur et al. |
| 2010/0322022 A1 | 12/2010 | Shinozaki et al. |
| 2011/0018597 A1 | 1/2011 | Lee et al. |
| 2011/0063898 A1 | 3/2011 | Ong |
| 2011/0153932 A1 | 6/2011 | Ware et al. |
| 2011/0211401 A1 | 9/2011 | Chan et al. |
| 2011/0267914 A1 | 11/2011 | Ishikura |
| 2011/0280307 A1 | 11/2011 | Macinnis et al. |
| 2011/0292743 A1 | 12/2011 | Zimmerman |
| 2011/0299353 A1 | 12/2011 | Ito et al. |
| 2012/0049911 A1 | 3/2012 | Ura |
| 2012/0133114 A1 | 5/2012 | Choi |
| 2012/0153999 A1 | 6/2012 | Kim |
| 2012/0242382 A1 | 9/2012 | Tsuchiya et al. |
| 2012/0243347 A1 | 9/2012 | Sampigethaya |
| 2012/0250440 A1 | 10/2012 | Wu |
| 2012/0281459 A1 | 11/2012 | Teman et al. |
| 2012/0327704 A1 | 12/2012 | Chan |
| 2013/0039131 A1 | 2/2013 | Haig et al. |
| 2013/0083591 A1 | 4/2013 | Wuu |
| 2013/0170289 A1 | 7/2013 | Grover et al. |
| 2014/0056093 A1 | 2/2014 | Tran et al. |
| 2014/0125390 A1 | 5/2014 | Ma |
| 2014/0136778 A1 | 5/2014 | Khailany et al. |
| 2014/0185366 A1 | 7/2014 | Chandwani et al. |
| 2014/0269019 A1 | 9/2014 | Kolar |
| 2015/0003148 A1 | 1/2015 | Iyer et al. |
| 2015/0029782 A1 | 1/2015 | Jung |
| 2015/0063052 A1 | 3/2015 | Manning |
| 2015/0187763 A1 | 7/2015 | Kim et al. |
| 2015/0213858 A1 | 7/2015 | Tao |
| 2015/0248927 A1 | 9/2015 | Fujiwara |
| 2015/0279453 A1 | 10/2015 | Fujiwara |
| 2015/0302917 A1 | 10/2015 | Grover |
| 2015/0310901 A1 | 10/2015 | Jung |
| 2015/0357028 A1 | 12/2015 | Huang et al. |
| 2016/0005458 A1 | 1/2016 | Shu et al. |
| 2016/0027500 A1 | 1/2016 | Chuang et al. |
| 2016/0064068 A1 | 3/2016 | Mojumder |
| 2016/0141023 A1 | 5/2016 | Jung |
| 2016/0225436 A1 | 8/2016 | Wang |
| 2016/0225437 A1 | 8/2016 | Kumar |
| 2016/0247559 A1 | 8/2016 | Atallah et al. |
| 2016/0284392 A1 | 9/2016 | Block et al. |
| 2016/0329092 A1 | 11/2016 | Akerib |
| 2017/0194046 A1 | 7/2017 | Yeung, Jr. et al. |
| 2017/0345505 A1* | 11/2017 | Noel .................. G11C 8/16 |
| 2018/0122456 A1 | 5/2018 | Li |
| 2018/0123603 A1 | 5/2018 | Chang |
| 2018/0157621 A1 | 6/2018 | Shu et al. |
| 2018/0158517 A1 | 6/2018 | Shu et al. |
| 2018/0158518 A1 | 6/2018 | Shu et al. |
| 2018/0158520 A1 | 6/2018 | Shu |
| 2020/0117398 A1 | 4/2020 | Haig et al. |
| 2020/0160905 A1 | 5/2020 | Charles et al. |
| 2020/0301707 A1 | 9/2020 | Shu et al. |
| 2020/0403616 A1 | 12/2020 | Shu et al. |

OTHER PUBLICATIONS

Wang et al., "A Two-Write and Two-Read Multi-Port SRAM with Shared Write Bit-Line Scheme and Selective Read Path for Low Power Operation", Journal of Low Power Electronics vol. 9. 9-22, 2013, Department of Electronics Engineering and Institute of Electronics, National Chiao-Tung University, Hsinchu 300, Taiwan (Accepted: Feb. 11, 2013), 14 pages.

Accompanies a new application submitted herewith.

Is filed within three (3) months of the Filing Date or before the mailing date of a First Office Action on the merits; or.

After the period defined in (b) but before the mailing date of a Final Rejection or Notice of Allowance, or.

Is filed after the first Office Action and more than three months after the application's filed or PCT national stage date of entry filing but, as far as is known to the undersigned prior to the mailing date of either a final rejection or a notice of allowance, and is accompanied by either the fee set forth in 37 CFR § 1.17(p) or a certification as specified in 37 CFR § 1.97(e), as checked below or.

Is filed after the mailing date of either a final rejection or a notice of allowance, and the issue fee has not been paid, and is accompanied by the requisite petition fee set forth in 37 CFR § 1.17(p) and a certification as specified in 37 CFR § 1.97(e), as checked below.

Each item of information contained in the Information Disclosure Statement was first cited in a communication from a foreign patent office in a counterpart foreign application not more than three months prior to the filing date of the Information Disclosure Statement; or.

No item of information contained in the Information Disclosure Statement was cited in a communication from a foreign patent office in a counterpart foreign application, and, to the knowledge of the person signing this Statement after making reasonable inquiry, no item of information contained in the Information Disclosure Statement was known to any individual designated in § 1.56(c) more than three months prior to the filing of the Information Disclosure Statement.

* cited by examiner

| WE | WBL | WBLb | D (n) |
|---|---|---|---|
| 0 | x | x | D(n-1) |
| 1 | 0 | 1 | 0 |
| 1 | 1 | 0 | 1 |
| 1 | 0 | 0 | D(n-1) |

D(n) is storage data on the current write cycle
D(n-1) is storage data before the current write cycle

FIGURE 3

| WE | WEb | WBL | WBLb | D(n) |
|---|---|---|---|---|
| 0 | 0 | x | x | D(n-1) |
| 1 | 0 | 0 | 1 | 0 |
| 1 | 0 | 1 | 0 | 1 |
| 1 | 0 | 0 | 0 | D(n-1) |
| 0 | 1 | 0 | 1 | 1 |
| 0 | 1 | 1 | 0 | 0 |
| 0 | 1 | 0 | 0 | D(n-1) |
| 1 | 1 | x | x | Not Allow |

D(n) is storage data on the current write cycle
D(n-1) is storage data before the current write cycle

COMPUTATIONAL MEMORY CELL AND PROCESSING ARRAY DEVICE USING THE MEMORY CELLS FOR XOR AND XNOR COMPUTATIONS

PRIORITY CLAIMS/RELATED APPLICATIONS

This application claims the benefit and priority under 35 USC 119(e) and 120 to U.S. Provisional Patent Application Ser. No. 62/430,767 filed Dec. 6, 2016 and entitled "Computational Dual Port SRAM Cell And Processing Array Device Using The Dual Port SRAM Cells For Xor And Xnor Computations", the entirety of which is incorporated herein by reference.

FIELD

The disclosure relates generally to a static random access memory cell that may be used for computations.

BACKGROUND

An array of memory cells, such as dynamic random access memory (DRAM) cells, static random access memory (SRAM) cells, content addressable memory (CAM) cells or non-volatile memory cells, is a well-known mechanism used in various computer or processor based devices to store digital bits of data. The various computer and processor based devices may include computer systems, smartphone devices, consumer electronic products, televisions, internet switches and routers and the like. The array of memory cells are typically packaged in an integrated circuit or may be packaged within an integrated circuit that also has a processing device within the integrated circuit. The different types of typical memory cells have different capabilities and characteristics that distinguish each type of memory cell. For example, DRAM cells take longer to access, lose their data contents unless periodically refreshed, but are relatively cheap to manufacture due to the simple structure of each DRAM cell. SRAM cells, on the other hand, have faster access times, do not lose their data content unless power is removed from the SRAM cell and are relatively more expensive since each SRAM cell is more complicated than a DRAM cell. CAM cells have a unique function of being able to address content easily within the cells and are more expensive to manufacture since each CAM cell requires more circuitry to achieve the content addressing functionality.

Various computation devices that may be used to perform computations on digital, binary data are also well-known. The computation devices may include a microprocessor, a CPU, a microcontroller and the like. These computation devices are typically manufactured on an integrated circuit, but may also be manufactured on an integrated circuit that also has some amount of memory integrated onto the integrated circuit. In these known integrated circuits with a computation device and memory, the computation device performs the computation of the digital binary data bits while the memory is used to store various digital binary data including, for example, the instructions being executed by the computation device and the data being operated on by the computation device.

More recently, devices have been introduced that use memory arrays or storage cells to perform computation operations. In some of these devices, a processor array to perform computations may be formed from memory cells. These devices may be known as in-memory computational devices.

Big data operations are data processing operations in which a large amount of data must be processed. Machine learning uses artificial intelligence algorithms to analyze data and typically require a lot of data to perform. The big data operations and machine learning also are typically very computationally intensive applications that often encounter input/output issues due to a bandwidth bottleneck between the computational device and the memory that stores the data. The above in-memory computational devices may be used, for example, for these big data operations and machine learning applications since the in-memory computational devices perform the computations within the memory thereby eliminating the bandwidth bottleneck.

An SRAM cell can be configured to perform basic Boolean operations such as AND, OR, NAND and NOR. This SRAM cell can also support a Selective Write operation. However, this SRAM cell cannot perform certain logic functions that may be desirable. For example, it is desirable to be able to implement an exclusive OR (XOR) logic function since the XOR logic function is frequently used in a search operation when the search key needs to be compared to the contents in storage.

BRIEF DESCRIPTION OF THE DRAWINGS

FIG. 3 illustrates a write port truth table for the dual port SRAM cell of FIG. 1;

FIG. 5 illustrates a write port truth table for the dual port SRAM cell of FIG. 4;

DETAILED DESCRIPTION OF ONE OR MORE EMBODIMENTS

The disclosure is particularly applicable to a CMOS implemented memory cell and processing array with a plurality of the memory cells that are capable to performing an exclusive OR (XOR) or exclusive NOR (XNOR) logic function (collectively a "exclusive logic operation") and it is in this context that the disclosure will be described. It will be appreciated, however, that the memory cell and processing array has greater utility and is not limited to the below disclosed implementations since the memory cell may be constructed using different processes and may have different circuit configurations than those disclosed below that perform the exclusive OR (XOR) or exclusive NOR (XNOR) logic function and so are within the scope of this disclosure. For purposes of illustration, a dual port SRAM cell is disclosed below and in the figures. However, it is understood that the SRAM computation cell and processing array may also be implemented with an SRAM cell having three or more ports and the disclosure is not limited to the dual port SRAM cell disclosed below. It is also understood that the SRAM cell having three or more ports may be slightly differently constructed than the dual port SRAM shown in the figures, but one skilled in the art would understand how to construct those three or more port SRAMs for the disclosure below.

Furthermore, although an SRAM cell is used in the examples below, it is understood that the disclosed memory cell for computation and the processing array using the memory cells may be implemented using various different types of memory cells including the DRAMs, CAMs, non-volatile memory cells and non-volatile memory devices and these implementations using the various types of memory cells are within the scope of the disclosure.

Figure 1:
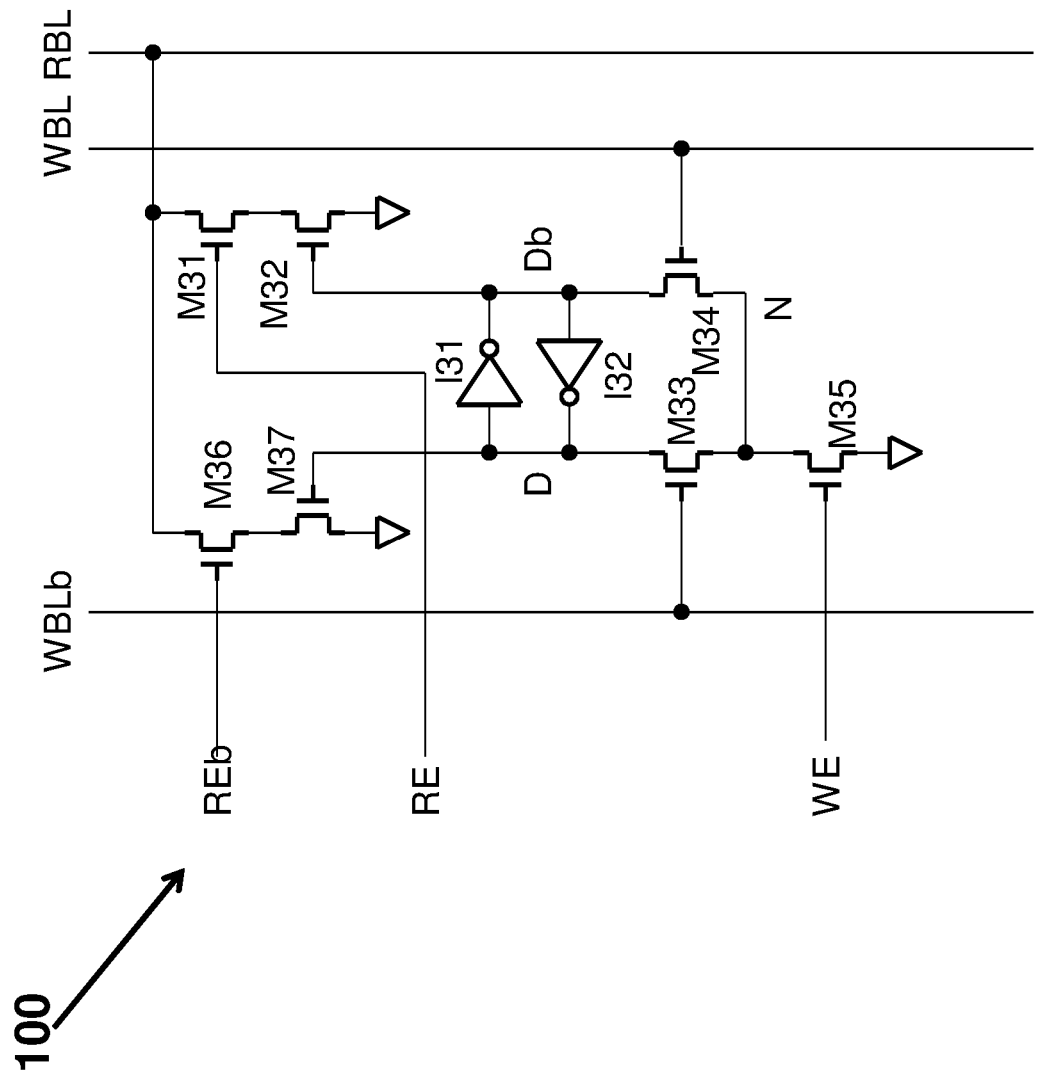
FIG. 1 illustrates an implementation of a dual port SRAM cell that can perform an XOR or XNOR function.

FIG. 1 illustrates an implementation of a dual port SRAM cell 100 with an XOR or XNOR function. The dual port SRAM cell 100 may include two cross coupled inverters I31, I32 and two access transistors M33 and M34 that are coupled together as shown in FIG. 1 to form the basic SRAM cell. The SRAM cell may be operated as a storage latch and may have a read port and a write port to form a dual port SRAM. The two inverters I31, I32 are cross coupled since the input of the first inverter is connected to the output of the second inverter (labeled D) and the output of the first inverter (labeled Db) is coupled to the input of the second inverter as shown in FIG. 1. The cross coupled inverters I31, I32 form the latch of the SRAM cell. The access transistor M34 and M33 may have their respective gates connected to a write bit line and its complement bit line (WBL, WBLb), respectively. A write word line carries a signal WE. The write word line WE is coupled to the gate of a transistor M35 that is part of the write access circuitry for the SRAM cell.

The circuit in FIG. 1 may also have a read word line RE, a complementary read word line REb, a read bit line RBL and a read port formed by transistors M31, M32 coupled together and transistors M36, M37 coupled together to form as isolation circuit. The read word line RE may be coupled to the gate of transistor M31 that forms part of the read port while the read bit line RBL is coupled to the drain terminal of transistor M31. The gate of transistor M32 may be coupled to the Db output from the cross coupled inverters I31, I32. The isolation circuit isolates the latch output Db (in the example in FIG. 1) from the read bit line and signal/voltage level of RBL so that the Db signal is not susceptible to the lower bit line level caused by multiple "0" data stored in multiple cells in contrast to the typical SRAM cell.

The complimentary read word line REb may be coupled to the gate of transistor M36 that forms part of the read port while the read bit line RBL is coupled to the drain terminal of transistor M36. The gate of transistor M37 may be coupled to the D output from the cross coupled inverters I31, I32. The isolation circuit isolates the latch output D (in the example in FIG. 1) from the read bit line and signal/voltage level of RBL so that the D signal is not susceptible to the lower bit line level caused by multiple "0" data stored in multiple cells in contrast to the typical SRAM cell.

The cell 100 may further include two more read word line transistors M36, M37 and one extra complementary read word line, REb. When the read port is active, either RE or REb is high and the REb signal/voltage level is the complement of RE signal/voltage level. RBL is pre-charged high, and if either one of-the transistor pair M31, M32 are both turned on or the transistors pair M36, M37 are both turned on, RBL is discharged to 0. If none of (M31, M32) or (M36, M37) series transistors is on, then RBL stay high as 1 since it was precharged high and not coupled to ground. The cell 100 may operate as a dual-port SRAM cell. The write operation is activated by WE and the data is written by toggling of WBL and WBLb. The read operation is activated by RE and the read data is accessed on RBL. The cell 100 may further be used for computation where RBL is also used for logic operation. The following equation below, where D is the data stored in the cell and Db is the complement data stored in the cell, describes the functioning/operation of the cell:

$$RBL=AND(NAND(RE,Db),NAND(REb,D))=XNOR(RE,D) \quad (EQ1)$$

If the word size is 8, then the word is stored in 8 cells (with one cell being shown in FIG. 1) on the same bit line. On a search operation, an 8 bit search key can be entered using the RE, REb lines of eight cells to compare the search key with the cell data. If the search key bit is 1, then the corresponding RE=1 and REb=0 for that cell. If the search key bit is 0, then the corresponding RE=0 and REb=1. If all 8 bits match the search key, then RBL will be equal to 1. If any one or more of the 8 bits is not matched, then RBL will be discharged and be 0 indicating no match. Therefore, this cell 100 (when used with 7 other cells for an 8 bit search key) can perform the same XNOR function but uses half the number of cell as the typical SRAM cell. The following equation for the multiple bits on the bit line may describe the operation of the cells as:

$$RBL=AND(XNOR(RE1,D1),XNOR(RE2,D2),\ldots,XNOR(REi,Di)), \text{ where } i \text{ is the number of active cell.} \quad (EQ2)$$

By controlling either RE or REb to be a high signal/on, the circuit 100 may also be used to do logic operations mixing true and complement data as shown below:

$$RBL=AND(D1,D2,\ldots,Dn,Dbn+1,Dbn+2,\ldots Dbm) \quad (EQ3)$$

where D1, D2, . . . Dn are "n" number of data with RE on and Dbn+1, Dbn+2, . . . Dbm are m-n number of data with REb on.

Furthermore, if the cell 100 stores inverse data, meaning WBL and WBLb shown in FIG. 1 are swapped, then the logic equation EQ1 becomes an XOR function and logic equation EQ3 becomes a NOR function and can be expressed as EQ4 and EQ5:

$$RBL=XOR(RE,D) \quad (EQ4)$$

$$RBL=NOR(D1,D2,\ldots,Dn,Dbn+1,Dbn+2,\ldots Dbm) \quad (EQ5)$$

where D1, D2, . . . Dn are n number of data with RE on and Dbn+1, Dbn+2, . . . Dbm are m-n number of data with REb on.

In another embodiment, the read port of the circuit 100 in FIG. 1 may be reconfigured differently to achieve different Boolean equation. Specifically, transistors M31, M32, M36 and M37 may be changed to PMOS, the source terminal of M32 and M37 may be VDD instead of VSS/ground, the bit line is pre-charged to 0 instead of 1, and the word line RE/REb active state is 0. In this embodiment, the logic equations EQ1 is inverted so that RBL is an XOR function of RE and D (EQ6). EQ3 is rewritten as an OR function (EQ7) as follows:

$$RBL=XOR(RE,D) \quad (EQ6)$$

$$RBL=OR(D1,D2,\ldots,Dn,Dbn+1,Dbn+2,\ldots Dbm) \quad (EQ7)$$

where D1, D2, . . . Dn are n number of data with RE on and Dbn+1, Dbn+2, . . . Dbm are m-n number of data with REb on.

If the cell stores the inverse data of the above discussed PMOS read port, meaning WBL and WBLb is swapped, then $$RBL=XNOR(RE,D) \quad (EQ8)$$

$$RBL=NAND(D1,D2,\ldots,Dn,Dbn+1,Dbn+2,\ldots Dbm) \quad (EQ9)$$

where D1, D2, . . . Dn are n number of data with RE on and Dbn+1, Dbn+2, . . . Dbm are m-n number of data with REb on.

For example, consider a search operation where a digital word needs to be found in a memory array in which the memory array can be configured as each bit of the word stored on the same bit line. To compare 1 bit of the word, then the data is stored in a cell and the RE signal applied to the cell is the search key ("Key"), then EQ1 can be written as below:

$$RBL=XNOR(Key,D) \quad (EQ10)$$

If Key=D, then RBL=1. If the word size is 8 bits as D[0:7], then the search key Key[0:7] is an RE signal applied to each cell corresponding to the value of each bit in the search key, then EQ2 can be expressed as search result and be written as below:

$$RBL=AND(XNOR(Key[0],D[0]),XNOR(Key[1],D[1]),\ldots,XNOR(Key[7],D[7])) \quad (EQ11)$$

If all Key[i] is equal to D[i] where i=0-7, then the search result RBL is a match. If any one or more of Key[i] is not equal to D[i], then the search result is not a match. A parallel search can be performed in one operation by arranging multiple data words along the same word line and on parallel bit lines with each word on one bit line.

Figure 2:
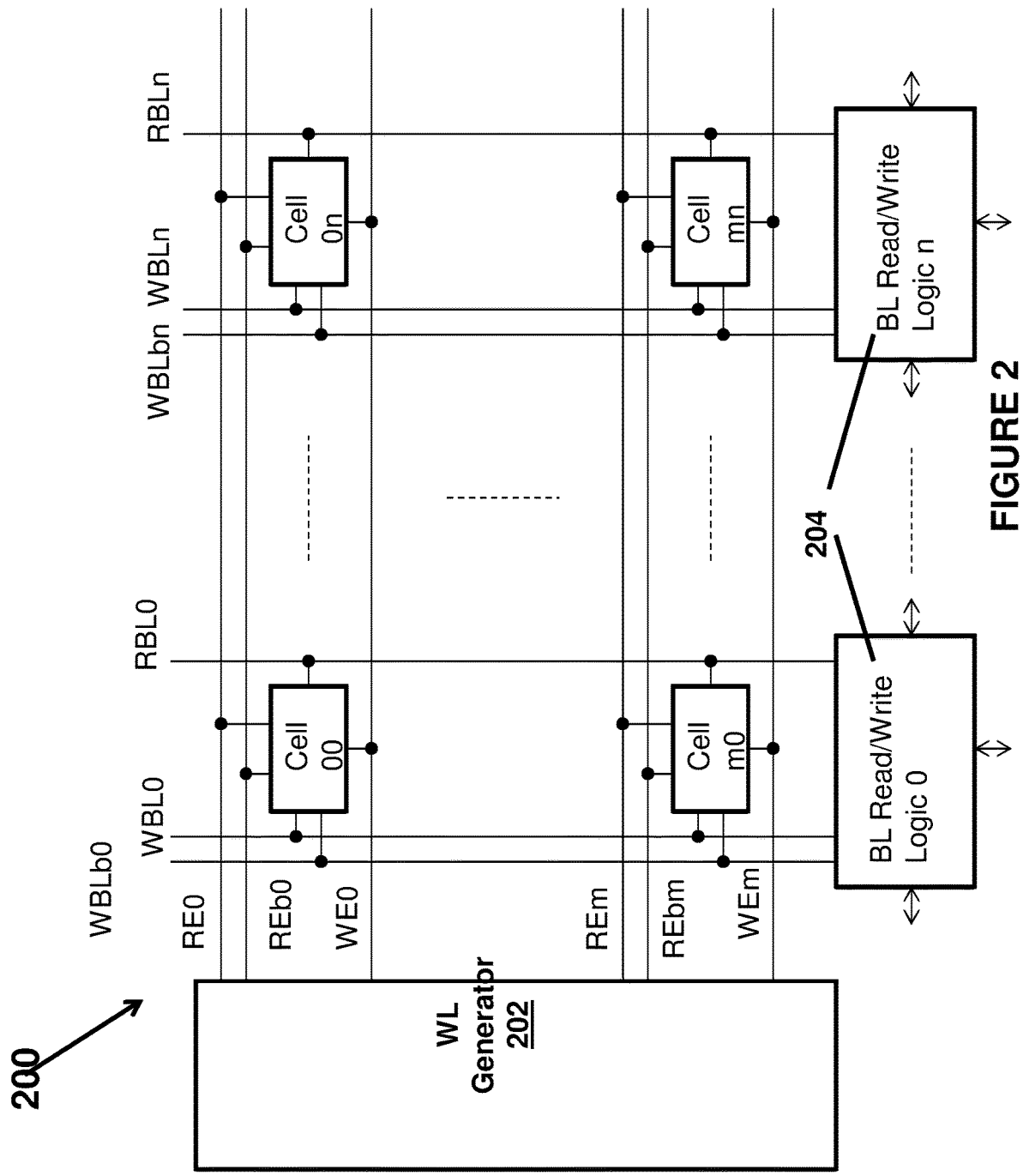
FIG. 2 illustrates an implementation of a processing array that has a plurality of the SRAM cells shown in FIG. 1 and performs an XOR or XNOR logic function.

FIG. 2 illustrates an implementation of a processing array 200 that has a plurality of the SRAM cells shown in FIG. 1 (cell 00, . . . , cell 0n and cell m0, . . . , cell mn formed in an array) that can perform an XOR or XNOR logic function or the other logic functions as disclosed above. The array shown is formed by M word lines (RE0, REb0, WE0, . . . , REm, REbm, WEm) and N bit lines (WBLb0, WBL0, RBL0, . . . , WBLbn, WBLn, RBLn). The processing array 200 may have a word line generator 202 that generates the word line signals/voltage levels and a plurality of bit line read/write logic circuits (BL Read/Write Logic 0, . . . , BL Read/Write Logic n) 204 that receive and process the bit line signals to generate the results of the Boolean logic function.

In a read cycle, WL generator 202 generates one or multiple RE or REb signals in a cycle and RBL forms Boolean functions as described above whose results are sensed/read by the BL Read/Write Logic 204. The BL Read/Write Logic 204 processes the RBL result and sends it back to its WBL/WBLb for writing/using in that cell, or to the neighboring BL Read/Write Logic for writing/using in that neighboring cell, or send it out of this processing array. Alternatively, the BL Read/Write logic 204 can store RBL result from its own bit line or from the neighboring bit line in a latch so that the next cycle Read/Write logic can perform logic with the latched RBL result data.

In a write cycle, the WL generator 202 generates one or more WE signals for the cells to be written and the BL Read/Write Logic 204 processes the write data, either from its own RBL, or from the neighboring RBL or from out of this processing array. The ability of BL Read/Write Logic to process the data from the neighboring bit line means that the data can be shifting from one bit line to the neighboring bit line and one or more or all bit lines in the processing array may be shifting concurrently. The BL Read/Write Logic 204 can also decide not to write for a Selective Write operation based on RBL result. For example, WBL can be written to a data if RBL=1. If RBL=0, then a write is not performed.

FIG. 3 illustrates a write port truth table for the dual port SRAM cell of FIG. 1. If WE is 0, no write is performed (as reflected by the D(n−1) shown in FIG. 3). If WE is 1, then the storage nodes D and its complement Db are written by WBL and WBLb. D=1 and Db=0 if WBL=1 and WBLb=0. D=0 and D=1 if WBL=0 and WBLb=1. If both WBL and WBLb are 0, then no write is performed. So this cell can perform Selective Write function with WBL=WBLb=0, with WE=1.

When doing a Selective Write, it is often desired to write data "1" on some cells and data "0" to other cells on the same bit line. For the dual port XOR cell illustrated in FIG. 1, this can be accomplished by taking 2 cycles to write data in which data "1" is written in one cycle and data "0" is written in the other cycle.

Figure 4:
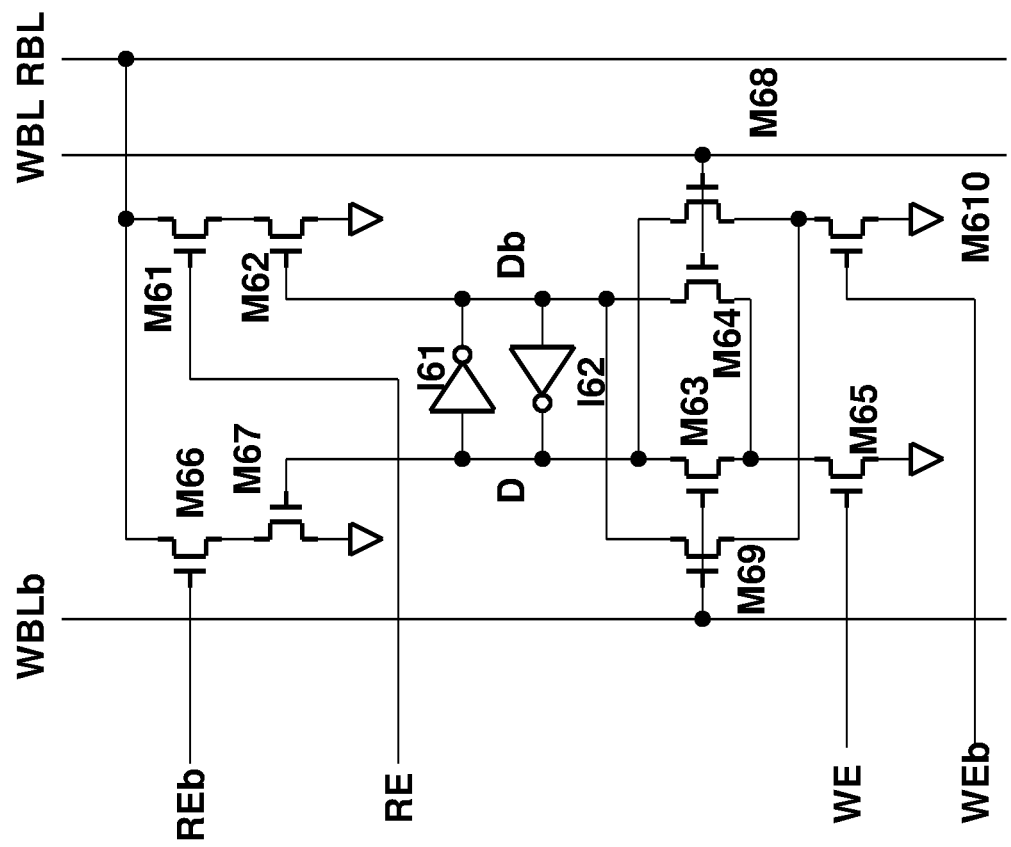
FIG. 4 illustrates a second implementation of a dual port SRAM cell that can perform an XOR or XNOR function and is capable to writing both "0" and "1" data.
Figure 6:
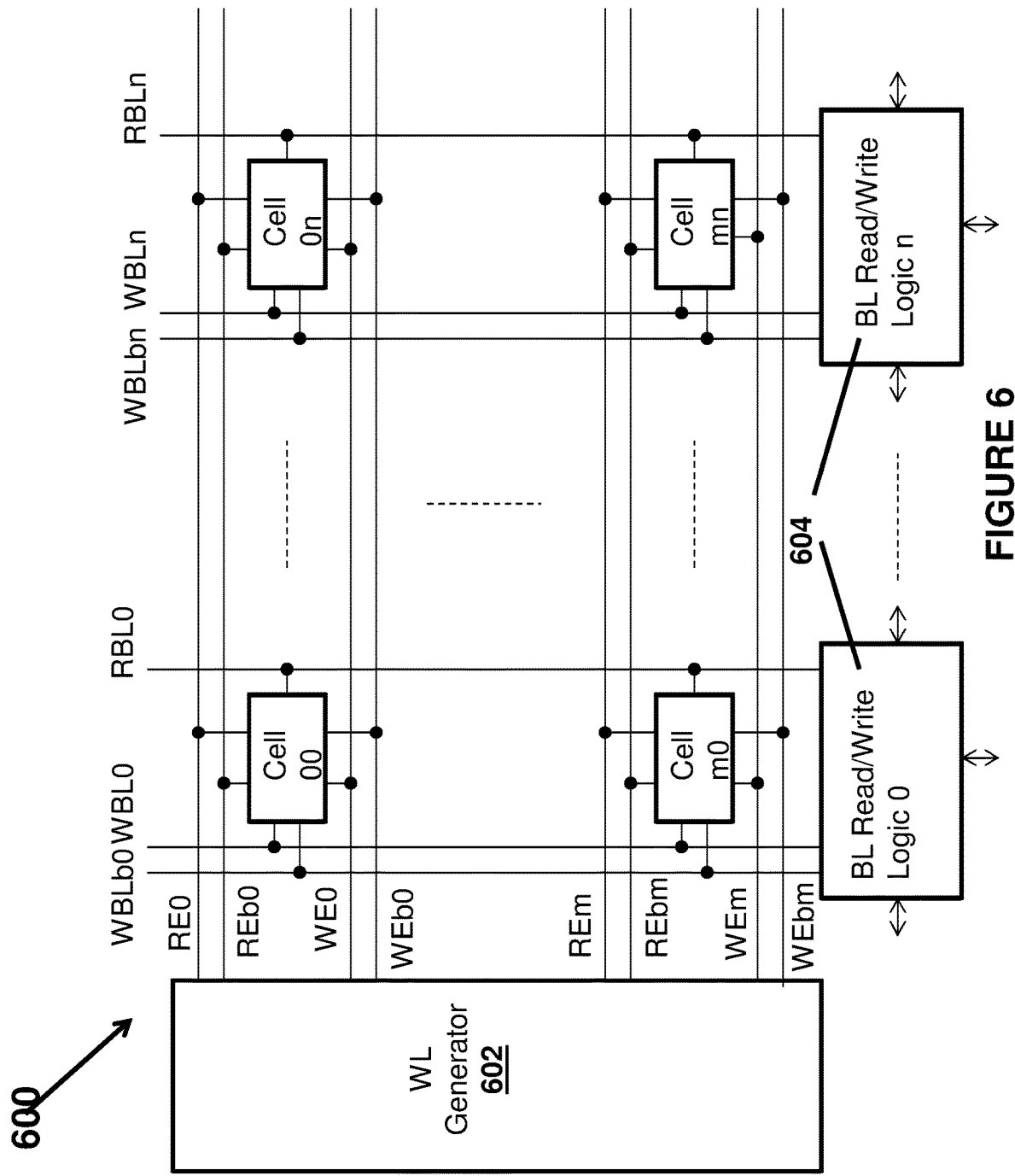
FIG. 6 illustrates an implementation of a processing array that has a plurality of the SRAM cells shown in FIG. 4 and performs an XOR or XNOR logic function.

In another embodiment of the SRAM cell shown in FIG. 4, the SRAM cell may have similar transistors as the cell in FIG. 1 that are coupled as described above and operate as described above (although labeled with different reference identifiers, M61-M67, I61 and I62 instead of M31-M37, I31 and I32 respectively) and three extra transistors M68, M69, M610 and one extra complementary write word line WEb that are coupled as shown in FIG. 4. Like the SRAM cell in FIG. 1, the SRAM cell in FIG. 4 can also use inverted data and different reconfigurations like the SRAM cell in FIG. 1. The three added transistors allow the inverted data (Db) to be written to the cells with WEb high, at the same time as data is being written to the cell with WE high. Thus, this embodiment of the SRAM cell is capable of writing both "0" and "1" data simultaneously. FIG. 5 shows the truth table of the write operation for the cell shown in FIG. 4. The first 4 rows, WEb=0, the write operation is the same as shown in cell shown in FIG. 1. However, when WE=0 and WEb=1, inverted data is written, meaning D=1, if WBL=0, WBLb=1; D=0 if WBL=1, WBLb=0. Selective Write is performed the same way with WE=0, WEb=1 that no write is performed if both WBL=WBLb=0. WE and WEb both are 1 is not allowed that cell is undefined under this condition. FIG. 6 illustrates an implementation of a processing array 600 that has a plurality of the SRAM cells shown in FIG. 4 and performs an XOR/XNOR or other logic functions and it has the same elements that operate in the same manner as shown in FIG. 2, but has the added WEb signals that are generated by the WL generator 602.

It is desired to do a sequence of logic operation on the processing array of 200 in FIG. 2 or 600 in FIG. 6. The sequence of logic operation can be implemented as logic operation described from EQ 1 to EQ11 and a Selective Write operation in the same cycle. One particular example as Compare and Write operation. WL Generator can send out a value on one pair or a plurality of pairs of the read word lines and complementary read word lines and compares with the value stored in the cells. The compare operation is an XNOR operation, meaning if the value is matched, RBL of those matched bit lines will be 1, and RBL of those unmatched bit lines will be 0. Matched bit lines' BL Read/Write logic can do Selective Write and write the values to the cells with write word lines are on; and unmatched bitlines' BL Read/Write logic will not perform the writing. The XOR cells in 200 and 600 are a dual port cell, RBL and WBL are separate lines and RE and WE are separate lines, so the compare operation on RBL of one set of RE and the selective write operation on WBL of the other set of WE can be performed at the same cycle. A sequence of Compare and Write operation can be done as a pipelined operation such that the first cycle is to do the Compare operation and RBL result is latched in BL Read/Write Logic, and the following cycle is to do Selective Write based on the previous cycle's latched RBL result, and on the same cycle do the next Compare operation. In this manner, RE, WE, RBL and WBL are just toggled once in a cycle to complete Compare and Write operation. U.S. Patent application 62/430,372, owned by the same assignee as the present application and incorporated herein by reference further describe a Full Adder implementation by doing 4 cycles Compare and write operation.

Returning to FIG. 2, on the write cycle, the WE of an unselected cell is 0, but one of WBL and WBLb is 1. For example, WEm is 1 for the cell m0 to be written, but WE0 is 0 for cell 00 not to be written. In the cell in FIG. 1, D and Db of the unselected cell shall keep the original value. But if D of the unselected cell stores a "1" and the drain of M35 is 0 and WBLb is 1, then at the instant M33 gate is turned on, the capacitance charge of node D is charge sharing with the capacitance of node N, the drain of M35 and sources of M33 and M34. The high level of D is lowered by this charge sharing, and if the node N capacitance is high enough, the level will be lowered such that I41 and I42 latch flip to the opposite data.

Figure 7:
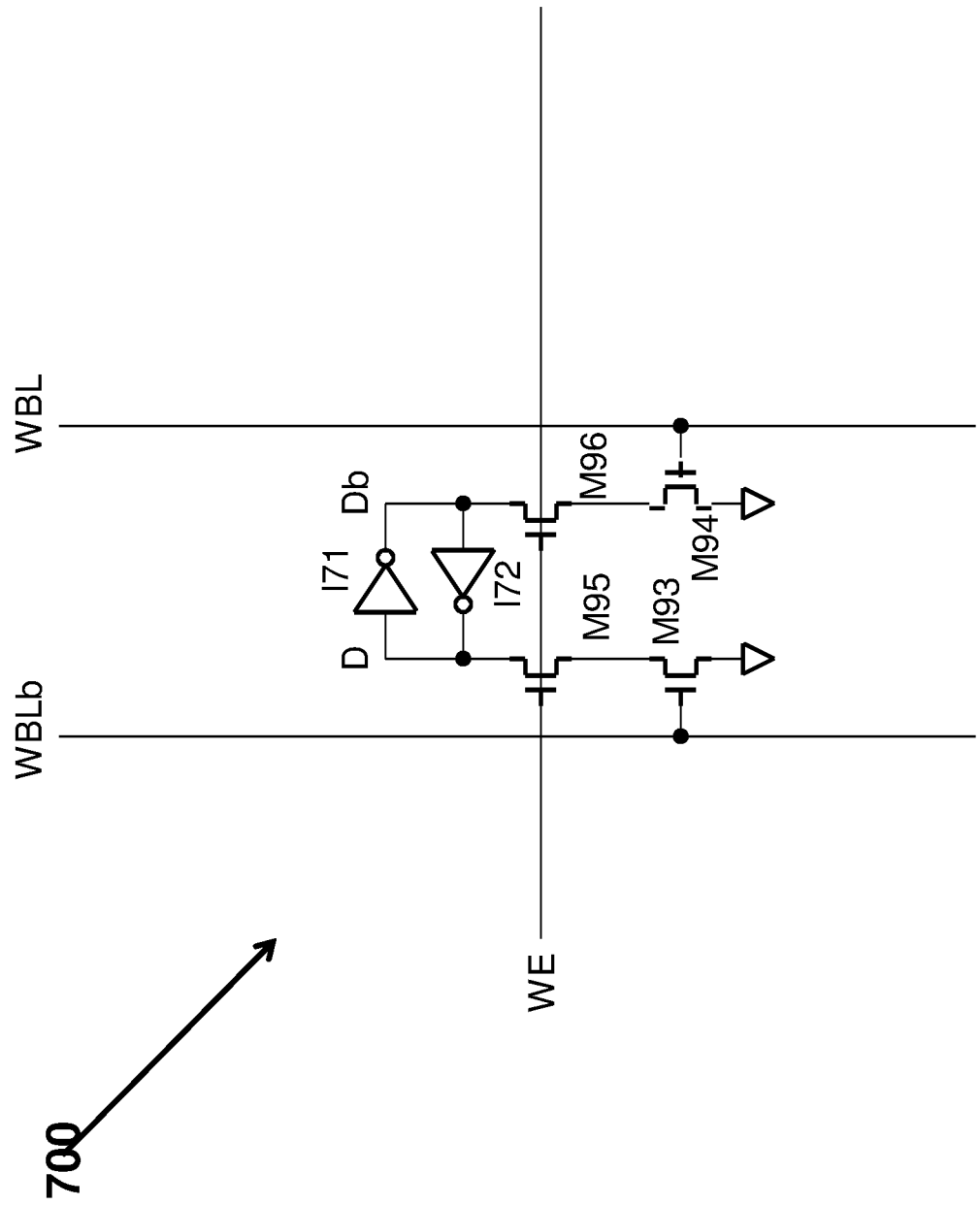
FIG. 7 illustrates another implementation of a dual port SRAM cell with an alternate write port.

FIG. 7 illustrates another implementation of a dual port SRAM cell 700 showing only an alternate write port that improves the charge sharing issue noted above. The cell 700 would have the similar read port(s) as shown in FIG. 1 although those ports are not shown in FIG. 7 for clarity purposes. In particular, in this embodiment, transistor M35 in FIG. 1 may be split into transistors M95 and M96 as shown in FIG. 7. In this embodiment, the node D can only charge share with a drain of M93 and source of M95, and the node D is no longer affected by the high voltage level of drain of M94 to avoid the data flipping to the opposite state. This improves the weakness of the unselective cell's charge sharing. The other way to improve FIG. 1 is to increase the capacitance of node D by having bigger gate size of I31 and I32 and the gate of read port. Note that it works the same way if transistors M93(M94), M95(M96) are swapped such that M93 with WBLb gated is tied to node D and M95 is tied to VSS. The splitting of the pull down transistor applies to all the write port of the cell discussed in this disclosure.

Figure 9:
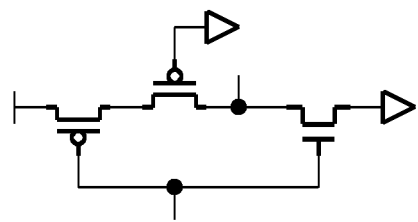
FIGS. 8 and 9 illustrate two example of a latch circuit that may be part of the SRAM cells shown in FIGS. 1, 4 and 7.
Figure 8:
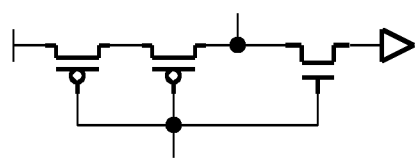

Returning to FIG. 1, the latch device I31 and I32 can be a simple inverter. To do a successful writing, the driver strength of series transistor M33 and M35 needs to be stronger than the pull up PMOS transistor of I32. This ratio needs to be around 2 to 3 times. In advanced technology like 28 nm or better, the layout of the PMOS and NMOS is preferred to have an equal length. So the PMOS transistor of I31 and I32 could be actually 2 or more PMOS transistors in series, this is shown as FIG. 8. For the ease of the layout, 1 or more of the series PMOS transistor could be tied to ground, this is shown in FIG. 9. The latch inverter in FIGS. 8 and 9 can be used in all the cells shown in figures and described above.

As set forth above, the disclosed computation SRAM cell and processing array may be implemented using an SRAM cell having more than 2 ports, such as a 3 port SRAM, a 4 port SRAM, etc. For example, the SRAM computation cell may be a 3-port cell that has 2 read ports and 1 write port. In this non-limiting example, the 3 port SRAM cell may be used to perform an operation like Y=OR (AND (A, B), AND (A,C)) more efficiently. Using the 3 port SRAM, the value of variable A is used twice using the 2 read ports. In this example operation, Y can be calculated in one cycle in which an AND (A,B) result is on RBL1 and an AND (A,C) result is on RBL2; and on the same cycle RBL2 data can be sent to RBL1 to do the OR operation to generate the final result. Therefore, this logic equation/operation can be done in 1 cycle when word lines are toggled once to generate the result, compared to 2 cycles of the dual port cell. Similarly, a 4 port SRAM cell could be used as well and the disclosure is not limited to any particular number of ports of the SRAM cell.

In the processing array disclosed above, the processing array can also do parallel shifting operation to shift the data from one bit line to the neighboring bit line on one or more or all bit lines concurrently.

Figure 10:
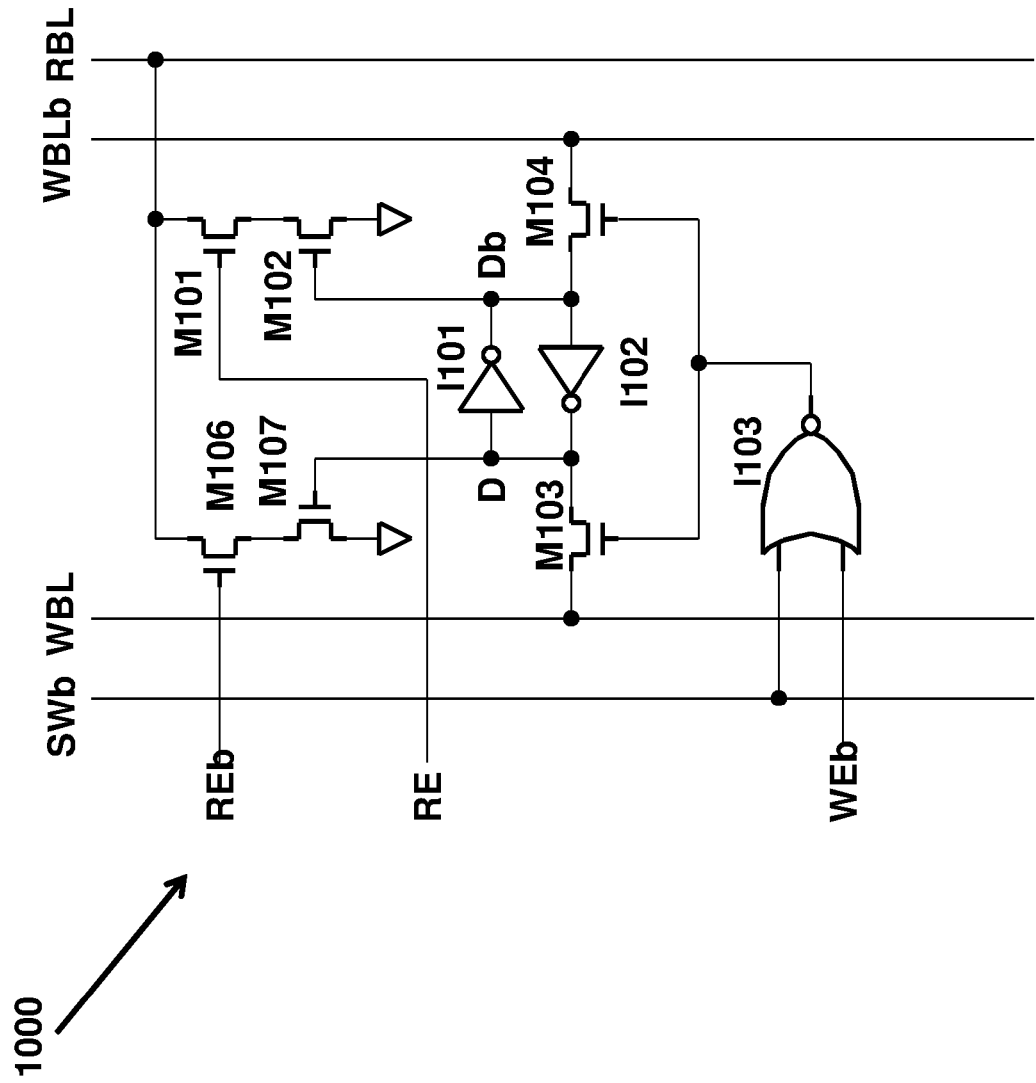
FIG. 10 illustrates an implementation of a dual port SRAM cell that can perform an XOR or XNOR function.

FIG. 10 illustrates an implementation of a dual port SRAM cell 1000 that may be used for computation. The cell in FIG. 10 has the same isolation circuits (M101, M102, M106, M107) for the read bit line, the same storage latches (I101, I102), the same read word line and complementary read word line as the cell described in FIG. 1. However, the Selective Write implementation is different in FIG. 10. The active low write word line, WEb, is connected to an input to a NOR logic gate 1103 whose other input is connected to the active low Selective Write control signal, SWb, to control the gate of access transistors M103 and M104. SWb is running in the same direction as the bit line. The writing to the cell can only happen when both write word line and selective write signals are active.

Figure 11:
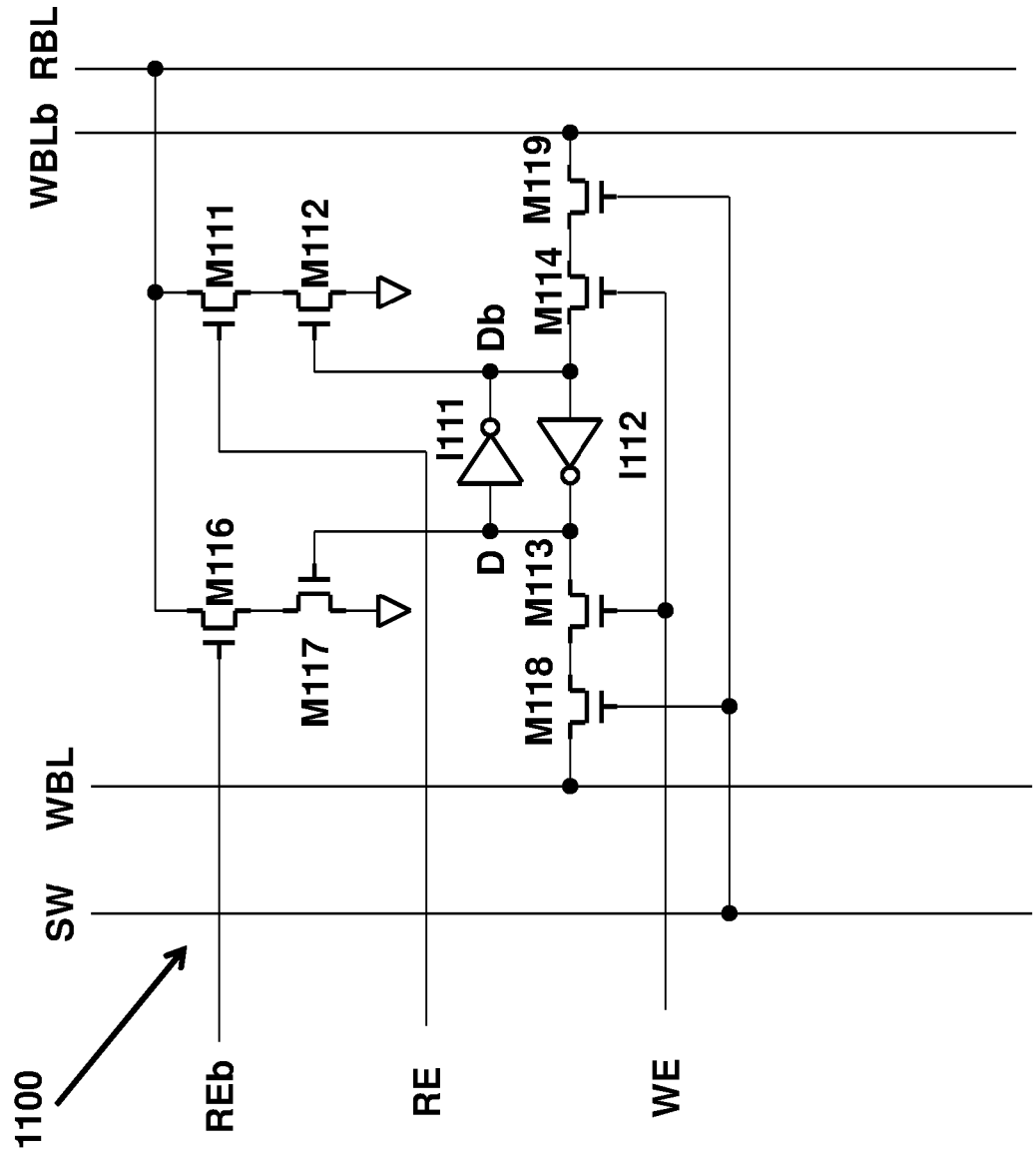
FIG. 11 illustrates another implementation of a dual port SRAM cell that can perform an XOR or XNOR function.

FIG. 11 illustrates another implementation of a dual port SRAM cell 1100 that may be used for computation. FIG. 11 is similar to FIG. 10, with selective write control signal SW, to combine with write word line, WE, to control the selective write operation. 2 access transistors M113 and M118 are in series to couple the storage latches to write bit line, WBL, and similarly, 2 access transistors M114 and M119 are in series to couple the storage latches to complementary write bit line, WBLb. The gates of M113 and M114 are coupled to WE and the gates of M118 and M119 are coupled to SW. SW is running in the same direction as the bit line. The writing to the cell can only happen when both write word line and selective write signals are active.

The foregoing description, for purpose of explanation, has been described with reference to specific embodiments. However, the illustrative discussions above are not intended to be exhaustive or to limit the disclosure to the precise forms disclosed. Many modifications and variations are possible in view of the above teachings. The embodiments were chosen and described in order to best explain the principles of the disclosure and its practical applications, to thereby enable others skilled in the art to best utilize the disclosure and various embodiments with various modifications as are suited to the particular use contemplated.

The system and method disclosed herein may be implemented via one or more components, systems, servers, appliances, other subcomponents, or distributed between such elements. When implemented as a system, such systems may include and/or involve, inter alia, components such as software modules, general-purpose CPU, RAM, etc.

found in general-purpose computers. In implementations where the innovations reside on a server, such a server may include or involve components such as CPU, RAM, etc., such as those found in general-purpose computers.

Additionally, the system and method herein may be achieved via implementations with disparate or entirely different software, hardware and/or firmware components, beyond that set forth above. With regard to such other components (e.g., software, processing components, etc.) and/or computer-readable media associated with or embodying the present inventions, for example, aspects of the innovations herein may be implemented consistent with numerous general purpose or special purpose computing systems or configurations. Various exemplary computing systems, environments, and/or configurations that may be suitable for use with the innovations herein may include, but are not limited to: software or other components within or embodied on personal computers, servers or server computing devices such as routing/connectivity components, handheld or laptop devices, multiprocessor systems, microprocessor-based systems, set top boxes, consumer electronic devices, network PCs, other existing computer platforms, distributed computing environments that include one or more of the above systems or devices, etc.

In some instances, aspects of the system and method may be achieved via or performed by logic and/or logic instructions including program modules, executed in association with such components or circuitry, for example. In general, program modules may include routines, programs, objects, components, data structures, etc. that perform particular tasks or implement particular instructions herein. The inventions may also be practiced in the context of distributed software, computer, or circuit settings where circuitry is connected via communication buses, circuitry or links. In distributed settings, control/instructions may occur from both local and remote computer storage media including memory storage devices.

The software, circuitry and components herein may also include and/or utilize one or more type of computer readable media. Computer readable media can be any available media that is resident on, associable with, or can be accessed by such circuits and/or computing components. By way of example, and not limitation, computer readable media may comprise computer storage media and communication media. Computer storage media includes volatile and non-volatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic tape, magnetic disk storage or other magnetic storage devices, or any other medium which can be used to store the desired information and can accessed by computing component. Communication media may comprise computer readable instructions, data structures, program modules and/or other components. Further, communication media may include wired media such as a wired network or direct-wired connection, however no media of any such type herein includes transitory media. Combinations of the any of the above are also included within the scope of computer readable media.

In the present description, the terms component, module, device, etc. may refer to any type of logical or functional software elements, circuits, blocks and/or processes that may be implemented in a variety of ways. For example, the functions of various circuits and/or blocks can be combined with one another into any other number of modules. Each module may even be implemented as a software program stored on a tangible memory (e.g., random access memory, read only memory, CD-ROM memory, hard disk drive, etc.) to be read by a central processing unit to implement the functions of the innovations herein. Or, the modules can comprise programming instructions transmitted to a general purpose computer or to processing/graphics hardware via a transmission carrier wave. Also, the modules can be implemented as hardware logic circuitry implementing the functions encompassed by the innovations herein. Finally, the modules can be implemented using special purpose instructions (SIMD instructions), field programmable logic arrays or any mix thereof which provides the desired level performance and cost.

As disclosed herein, features consistent with the disclosure may be implemented via computer-hardware, software and/or firmware. For example, the systems and methods disclosed herein may be embodied in various forms including, for example, a data processor, such as a computer that also includes a database, digital electronic circuitry, firmware, software, or in combinations of them. Further, while some of the disclosed implementations describe specific hardware components, systems and methods consistent with the innovations herein may be implemented with any combination of hardware, software and/or firmware. Moreover, the above-noted features and other aspects and principles of the innovations herein may be implemented in various environments. Such environments and related applications may be specially constructed for performing the various routines, processes and/or operations according to the invention or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques.

Aspects of the method and system described herein, such as the logic, may also be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic and/or functions disclosed herein may be enabled using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media) though again does not include transitory media. Unless the context clearly requires otherwise, throughout the description, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain presently preferred implementations of the invention have been specifically described herein, it will be apparent to those skilled in the art to which the invention pertains that variations and modifications of the various implementations shown and described herein may be made without departing from the spirit and scope of the invention. Accordingly, it is intended that the invention be limited only to the extent required by the applicable rules of law.

While the foregoing has been with reference to a particular embodiment of the disclosure, it will be appreciated by those skilled in the art that changes in this embodiment may be made without departing from the principles and spirit of the disclosure, the scope of which is defined by the appended claims.

The invention claimed is:

1. A processing array, comprising:
   at least one read bit line;
   at least two memory cells connected to the same at least one read bit line, each memory cell having a storage cell that stores data and complementary data and an isolation circuit that buffers the storage cell from signals on the at least one read bit line, the isolation circuit having a read word line that provides access by the at least one read bit line to the complementary data stored in the storage cell and a complementary read word line that provides access by the at least one read bit line to the data stored in the storage cell; and
   wherein the at least one read bit line is configured to provide read access to the storage cell data or the storage cell complementary data of each memory cell and the read word line and complementary read word line of the at least two memory cells are configured to be activated concurrently to form an exclusive logic function signal output from one of the at least two memory cells on the at least one read bit line.

2. The processing array of claim 1 further comprising a plurality of memory cells connected to the at least one read bit line to perform the exclusive logic function wherein each of the plurality of memory cells being turned on to perform the exclusive logic function does not adversely affect the performance of the exclusive logic function.

3. The processing array of claim 2 wherein the exclusive logic function further comprises one of an AND operation, an NOR operation, an OR operation and a NAND operation.

4. The processing array of claim 1 further comprising a plurality of memory cells connected to the at least one read bit line wherein a plurality of memory cells are activated to form a combinational logic result of the exclusive logic function of each memory cell on the at least one read bit line.

5. The processing array of claim 1 further comprising a write bit line connected to the at least two memory cells wherein data is written into the storage cell of one or more of the at least two memory cells using the write bit line.

6. The processing array of claim 5, wherein each memory cell is capable of performing a selective write operation.

7. The processing array of claim 6, wherein the processing array is capable of performing a logic operation and selective write operation in one cycle.

8. The processing array of claim 6, wherein the processing array is capable of performing a compare operation and a selective write operation in one cycle, the compare operation being performed with a value entered on one pair or a plurality pairs of read word lines and complementary read word lines and a compare result is generated and latched on the read bit line or a plurality of compare results are generated and latched on a plurality of read bit lines, and based on a previous cycle's latched compare result the selective write is performed on a current cycle on one pair or a plurality pairs of write bit lines and complementary write bit lines onto the cells activated by one or a plurality of write word lines.

9. The processing array of claim 1 further comprising a plurality of memory cells connected to the at least one read bit line and a write bit line connected to the plurality of memory cells wherein data may be written into the storage cell of one or more of the plurality of memory cells.

10. The processing array of claim 9 further comprising a write port that buffers the storage cell of each of the plurality of memory cells so that writing of data into any number of storage cells on a write bit line is performed.

11. The processing array of claim 1, wherein the exclusive logic function is one of an exclusive OR operation and an exclusive NOR operation.

12. The processing array of claim 1, wherein the processing array is capable of performing a parallel shifting operation.

13. The processing array of claim 1, wherein the processing array is capable of performing a search operation, wherein the search operation is performed with a search key entered on one pair or a plurality pairs of read word lines and complementary read word lines and the search result is on the read bit line or plurality of read bit lines.

14. The processing array of claim 1, wherein each memory cell is a static random access memory cell.

15. The processing array of claim 14, wherein each static random access memory cell is one of a two port static random access memory cell, a three port static random access memory cell and a four port static random access memory cell.

16. The processing array of claim 1, wherein each memory cell is a non-volatile memory.

17. The processing array of claim 16, wherein the non-volatile memory is one of a non-volatile memory cell and a non-volatile memory device.

18. A processing array, comprising:
   at least one read bit line;
   at least two memory cells connected to the same at least one read bit line, each memory cell having a storage cell that stores data and complementary data and an isolation circuit that buffers the storage cell from signals on the at least one read bit line, the isolation circuit having a read word line that provides access by the at least one read bit line to the complementary data stored in the storage cell and a complementary read word line that provides access by the at least one read bit line to the data stored in the storage cell; and one of the at least two memory cells forms, when the read word line and complementary read word line are activated concurrently, an exclusive logic function signal output from the one of the at least two memory cells on the at least one read bit line.

* * * * *